US005390349A

United States Patent [19]

Joshi et al.

[11] Patent Number: 5,390,349

[45] Date of Patent: Feb. 14, 1995

[54] PLURAL TRANSFORMERS WITH ELONGATED CORES

[75] Inventors: Shankar R. Joshi, Elmont, N.Y.; Meta Rohde, Upper Saddle River, N.J.

[73] Assignee: Synergy Microwave Corporation, Paterson, N.J.

[21] Appl. No.: 935,549

[22] Filed: Aug. 26, 1992

[51] Int. Cl.[6] ........................ H04B 1/26; H03B 19/16; H01F 27/30

[52] U.S. Cl. .................................... 455/330; 307/529; 455/320; 336/184; 361/814

[58] Field of Search ............... 455/323, 325, 326, 330, 455/318–320; 333/25, 26; 336/131, 184; 307/529, 510, 257, 321; 361/814, 811, 809, 807, 808

[56] References Cited

U.S. PATENT DOCUMENTS

| | | | |
|---|---|---|---|
| 2,021,060 | 11/1935 | Hassel | 336/128 |
| 2,065,884 | 12/1936 | Braden | 330/166 |
| 2,075,683 | 3/1937 | Wheeler | 455/285 |
| 2,180,919 | 11/1939 | Pool | 361/417 |
| 2,226,822 | 12/1940 | Kirk et al. | 336/131 |
| 5,175,885 | 12/1992 | Lange | 455/330 |

FOREIGN PATENT DOCUMENTS

| | | | |
|---|---|---|---|
| 48289 | 1/1934 | Denmark | 336/184 |
| 8504063 | 9/1985 | WIPO | 455/330 |

OTHER PUBLICATIONS

Applied Microwave, Aug./Sep. 1989, Aug. 1, 1989, Cahana.

*Primary Examiner*—Edward F. Urban
*Assistant Examiner*—Mark D. Wisler
*Attorney, Agent, or Firm*—Lerner, David, Littenberg, Krumholz & Mentlik

[57] ABSTRACT

A manner of using a plurality of transformers having cylindrical cores such that operation of the transformers at high frequencies allows the cores of the transformers to be disposed parallel to each other and in relatively close proximity without substantial interference.

22 Claims, 7 Drawing Sheets

PLURAL TRANSFORMERS WITH ELONGATED CORES

BACKGROUND OF THE INVENTION

This invention pertains to apparatus and electrical circuits with a plurality of transformers, useful as mixers, modulators, phase detectors, limiters, and for other purposes.

Many transformers have cores which are toroid or balun shaped. The use of a toroid or balun has been recommended because of its ability to confine substantially all of the magnetic field within the toroid or balun itself. Not only is this efficient, but the confining of the electromagnetic field prevents undue electromagnetic interference to surrounding elements near the transformer. Preventing interference between electrical elements is particularly important when the surrounding elements are themselves electromagnetic in nature. Thus, it is advantageous to prevent interference between transformers in the same circuit. An additional advantage of toroid and balun cores are their capability of performing well in a large bandwidth.

However, manufacture of toroid and balun core transformers is awkward and expensive. For example, it is tedious to wind wires around a toroid or balun since the wire must be repeatedly looped in and out of the central hole or holes. The procedure of winding a balun or toroid core becomes more difficult as the core and the central hole become smaller. Further, it is difficult to affix a toroid structure transformer to a circuit board or other mounting means because it has no flat edges. A balun structure is also difficult to mount if the windings are disposed upon the only flat surfaces. Additionally, once a toroid or balun transformer is in place, its shape causes its point of connection with the circuit board to be mechanically unstable.

Other arrangements have been proposed for preventing electromagnetic interference between elements. Hassel, U.S. Pat. No. 2,021,060, discloses that for the various transformers in each stage of an amplifier, it is desirable to avoid the electromagnetic coupling caused by leakage lines of force between the different transformers in the different stages. Hassel teaches that two well known ways of preventing such electromagnetic coupling are to shield the transformers or arrange their axes at right angles to each other. Other references which disclose shielding the transformers of different stages include Braden, U.S. Pat. No. 2,065,884, and Wheeler, U.S. Pat. No. 2,075,683.

Despite this art, there is still need for further improvement.

SUMMARY OF THE INVENTION

The present invention addresses those needs.

In one aspect of the present invention, a transformer circuit comprises a mounting, a first transformer and a second transformer. Each transformer has an elongated core with a longitudinal axis and an outer surface, and primary and secondary winding disposed on the outer surface of the core. Each of the cores has a maximum width perpendicular to the longitudinal axis. In the most preferred arrangement wherein each core is in the form of a circular cylinder, the maximum width of each core is simply the diameter of the cylinder. The maximum widths of the cores define a "pair measuring distance" equal to the larger of the maximum widths. The circuit desirably further includes input means to each primary winding of each transformer for providing an electrical input signal, such that the input signal to the first transformer is between the frequencies of about 10 MHz to 6 GHz. The transformer circuit also includes a circuit means for interconnecting the transformers, and providing an output from the transformer circuit.

The first and second transformers are attached to the mounting such that the longitudinal axis of the cores are substantially parallel to one another, and the shortest difference between the outer surfaces of the cores is greater than or equal to the pair measuring distance and less than or equal to 20 times the pair measuring distance. In a highly practical arrangement, it is advantageous to make the shortest distance between 1.3 and 5 times the pair measuring distance. Preferably, the distance between the transformers would be 1.5 times the pair measuring distance. If so, in a practical arrangement, the shortest distance would be about 1.5 mm. As further explained below, the preferred circuits allow use of elongated rod-like cores instead of more complex and awkward shapes, but nonetheless provide freedom from unwanted magnetic interference between the two transformers. The present invention is not limited to just two transformers, but to any number of transformers where it is preferable to prevent electromagnetic interference within the circuit.

Desirably, the number of turns on each of the primary and secondary windings is between two to four turns. The transformer circuit may also include means for providing a local oscillator signal to the first input means, a radio frequency signal to the second input means, and an intermediate frequency signal from the output of the interconnect circuit, the intermediate frequency signal being derived from the local oscillator signal and the radio frequency signal.

Desirably, each core includes at least one planar end, with the planar end abutting the mounting, and such that the planar ends are circular. Preferably, at least a portion of the interconnect circuit is disposed between the first and second transformers, and that portion includes a diode ring.

In another aspect of the present invention, the pair measuring distance is determined by use of a measuring line. The measuring line is defined by the line between the points on each core which are closest to the other core. The measuring width of each core is the width of the core along the measuring line. The pair measuring distance is the larger of the measuring widths.

The present invention is particularly useful as a triple balanced mixer, which has two pairs of transformers, one pair to receive a local oscillator signal and the other pair to receive a radio frequency signal. The pair measuring distance is the largest width of the four transformers. The closest distance between the two pairs is greater than or equal to the pair measuring distance and less than or equal to 20 times the pair measuring distance. In a preferred embodiment, an intermediate frequency transformer is added, whereby its closest distance to the first transformer pair is greater than the pair measuring distance and less than 20 times the pair measuring distance as defined by the first pair and the intermediate frequency transformer. Likewise, the closest distance between the second transformer pair and the intermediate frequency transformer will be greater than the pair measuring distance and less than 20 times the pair measuring distance as defined by the intermediate frequency transformer and the second pair.

According to a further aspect of the invention, a method of making a transformer circuit includes affixing a first elongated core to a mounting, affixing a second elongated core to a mounting such that the longitudinal axis of the first core is parallel with the longitudinal axis of the second core, and after these have been mounted, forming a primary and secondary windings around each core, and interconnecting at least one of the windings with another one of the windings.

Preferably, the step of affixing the cores would include mounting the longitudinal axes of the cores perpendicular to the surface of the mounting, and abutting a flat end of each core to the mounting. It is desirable when affixing the second core to place it a spaced distance from the first core and preferably, at distances as discussed above. The circuit preferably is operated using a signal of a frequency between 10 MHz and 2 GHz applied to the primary winding of the first core or the primary winding of the second core.

These and other objects, features, and advantages of the present invention will be more readily apparent from the detailed description and the preferred embodiment set forth below, taken in conjunction with the accompanying drawings.

DETAILED DESCRIPTION OF THE PREFERRED EMBODIMENTS

Figure 1:
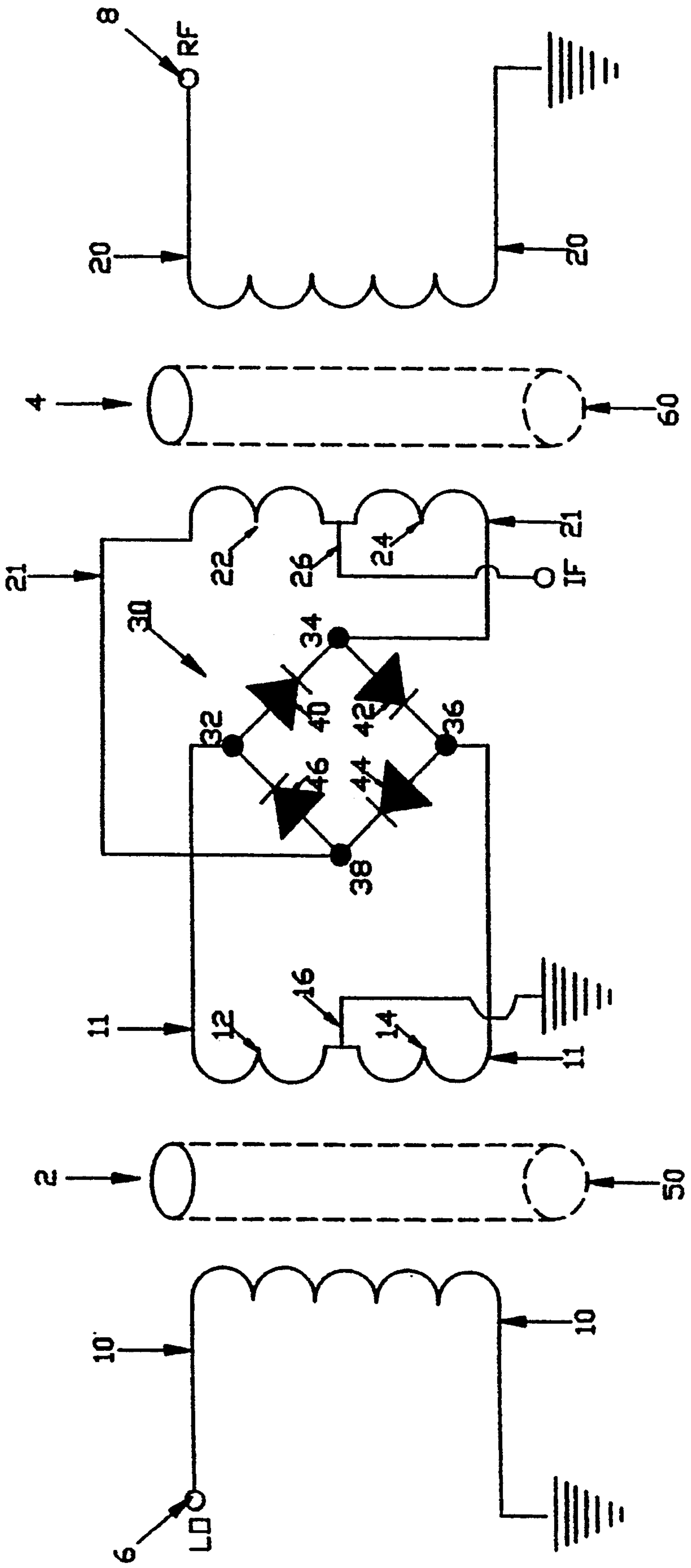
FIG. 1 is a schematic view of a preferred circuit embodiment using transformers of the present invention.

FIG. 1 is a schematic view of one preferred circuit utilizing the transformers of the present invention, namely, a double-balanced ring modulator for mixing a reference frequency with a local oscillating signal to create an intermediate frequency.

The mixer includes transformer 2, transformer 4, and diode ring 30. Transformer 2 has a primary winding 10 and a secondary winding 11 wrapped around core 50. One end of primary winding 10 is connected to ground, and the other end is connected to a local oscillator signal port 6. This port can accept a periodical oscillator signal within the frequency range of about 10 megahertz to 6 gigahertz. The primary winding 10 and each half of secondary winding 11 should have preferably two to four turns. The center tap 16 on secondary winding 11 is connected halfway between the top and bottom of the secondary winding, and is grounded. Thus, secondary winding 11 is a trificular winding wrapped around core 50, the winding 11 is effectively divided into different halves, namely top half 12 and bottom half 14. Although the terms "primary" and "secondary" are used to refer to windings herein, the designation is merely for purposes of convenience. Either winding of the transformer could be used to accept an applied signal input or to provide an electrical signal output.

Similarly, transformer 4 includes primary winding 20 and secondary winding 21 wrapped around core 60. One end of primary winding 20 is connected to radio frequency port 8, and the other end of primary winding 20 is grounded. Primary winding 20 and each half of secondary winding 21 has preferably two to four turns. Further, secondary winding 21 has a center tap 26 which divides the winding into a top half 22 and a bottom half 24. The center tap 26 of secondary winding 21 is connected to intermediate frequency port 7.

Diode ring 30 is connected between the two transformers 2 and 4. Diode ring 30 includes four diodes 40, 42, 44, and 46 joined in series in a ring. Thus, the corners 32, 34, 36, and 38 of the diode ring 30 each adjoin the anode end of one diode and the cathode end of another diode. Preferably, the diodes are Schottky diodes. Each corner of the diode ring is connected to the top half or bottom half of one of the secondary windings of one of the transformers. Thus, the top half 12 of secondary winding 11 is connected to corner 32, and the bottom half 14 of secondary winding 11 is connected to the opposite corner 36. Similarly, the top half 22 of secondary winding 21 is connected to corner 38, and the bottom half 24 of secondary winding 21 is connected to the opposite corner 34. All the diodes 40, 42, 44, and 46 should be matched as closely to the others as possible, in terms of impedance and other performance characteristics.

Figure 2:
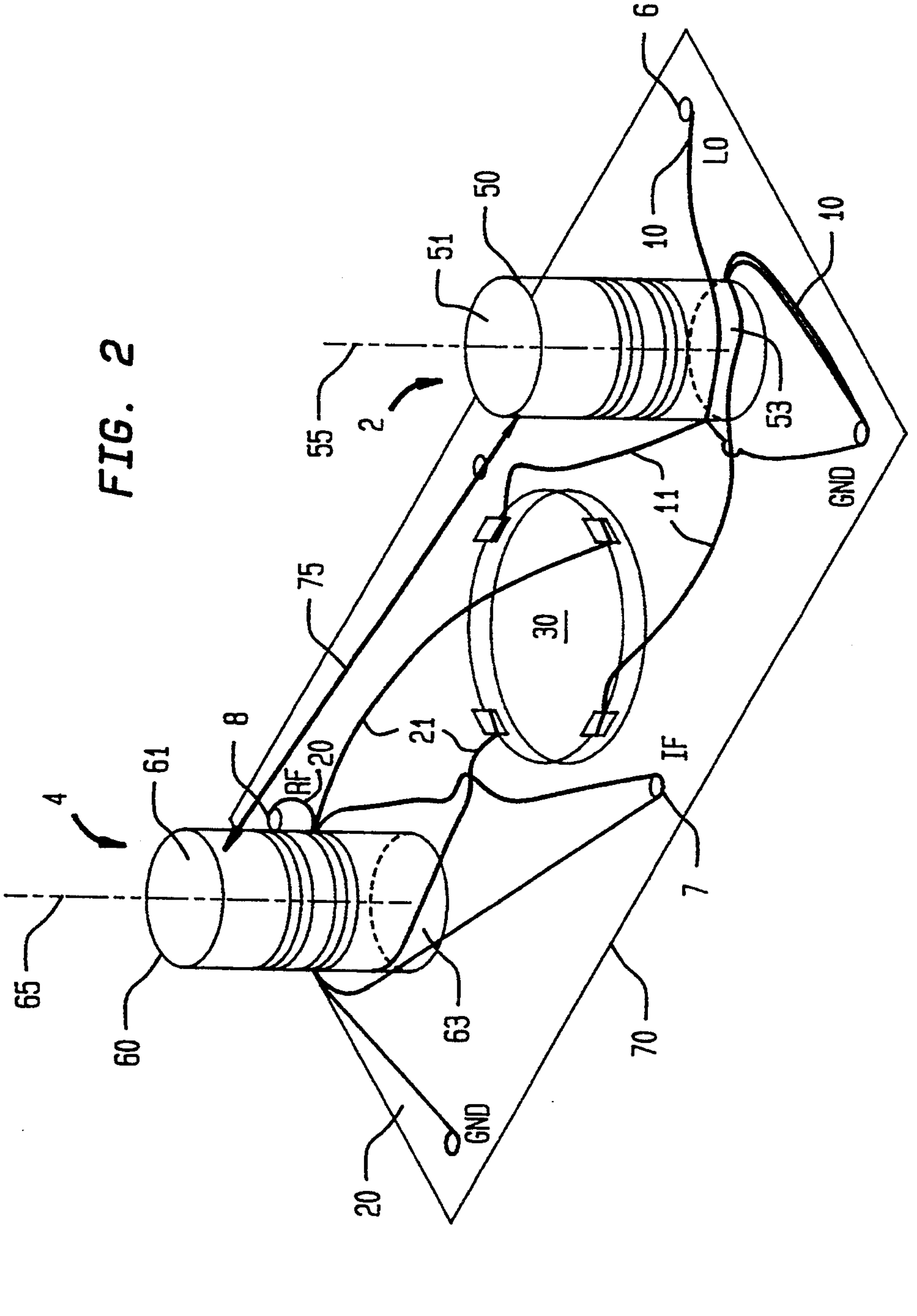
FIG. 2 is a three-dimensional view of a preferred embodiment using transformers of the present invention.

FIG. 2 represents a three-dimensional view of the mixer showing the specific physical structure and orientation of the transformers. As can be seen, both core 50 of transformer 2 and core 60 of transformer 4 are cylindrical. Core 50 has a generally planar top end 51 and a generally planar bottom end 53. Core 60 has a similar top end 61 and bottom end 63. As shown, the primary windings 10 and 20 and secondary windings 11 and 21 are wrapped around the outer surface of their respective cores two times. The wires around the core may be in the form of insulated twisted pair wires, a printed metal pattern on flexible printed circuit board, or highly flexible cable. Preferably, both of the cores 50 and 60 are about 1 mm in diameter and of uniform diameter throughout their length.

Although the cores 50 and 60 are shown as being uniform circularly cylindrical cores, the cores could be of a different elongated shape. For instance, the elongated cores may have noncircular cross-sectional shapes, as may top and bottom ends 51, 53, 61 and 63, although sharp edges should be avoided.

The shape of the surface area of the cores is one factor which will determine the closest acceptable distance two elongated cores may be placed in proximity to one another while preventing excessive electromagnetic interference. This is so because flux linkage takes on the shape and size of the surface area of elongated cores. Each core has a maximum width perpendicular to the longitudinal axis between two cores. Together, the maximum widths of the cores cooperatively define a pair measuring distance, which can be used to determine the optimal spacing between the transformers. The pair measuring distance is equal to the larger of the maximum widths of the two cores. Thus, for the uniform circularly cylindrical cores shown in FIG. 2, the pair measuring distance will be equal to the diameter of one of the cores, whichever is larger. In the case where the two cores have equal maximum widths, the pair measuring distance is equal to either one of these widths.

Figure 5:
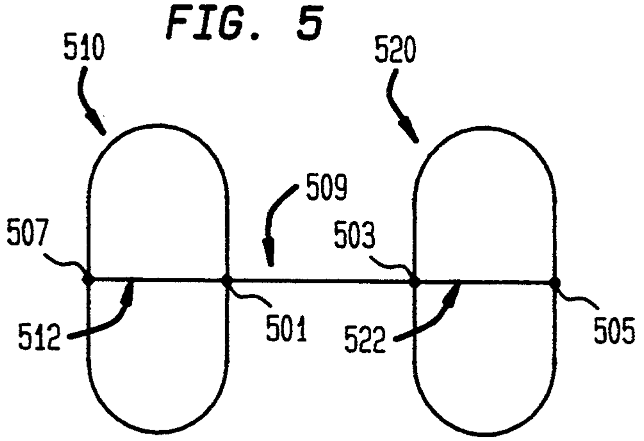
FIG. 5 is an illustration of two cores with a uniform elliptical cross-section in one particular orientation in accordance with the present invention.

If the shape of the cores are not circular, the "width" of each core, and hence the pair measuring distance, will depend on the orientation of the cores with respect to one another. The position where the flux leakage of one core will first begin interfering with the flux linkage of another core will be somewhere on the line where the outer surface of one core is closest to the outer surface of the other core. For example, as shown in FIG. 5, the closest distance between the outer surfaces of the two cores 510 and 520 is the distance 509 between point 501 on core 510 and point 503 on core 520. The operative width, or "measuring width" of each core will be the width of the core along the line defined by the two closest points of the two cores, referred to herein as "the measuring line". In other words, the operative width 512 of core 510 is the distance between point 501 and point 507, both points lying along the measuring line. In other words, the measuring width of core 510 is the width of the core along the line defined by points 501 and points 503. Likewise, the measuring width 522 of core 520 is the distance between point 503 and point 505, which is the width of core 520 along the measuring line defined by point 501 and point 503. The pair measuring distance would be the larger of measuring width 512 of core 510 or measuring width 522 of core 520.

Figure 6:
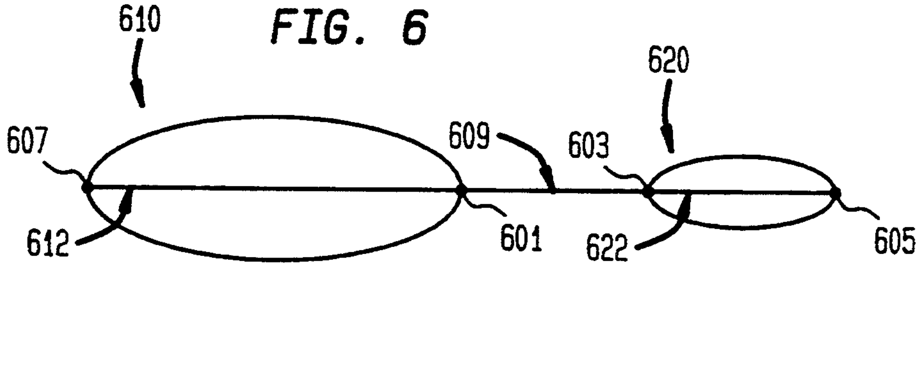
FIG. 6 is an illustration of two cores with a uniform elliptical cross-section in another particular orientation in accordance with the present invention.

FIG. 6 illustrates another arrangement of non-circular cores. The two closest points between the two cores 610 and 620 are point 601 on core 610 and point 603 on core 620. The line 609 defined by points 601 and 603 is the measuring line and determines the measuring widths of the cores. The measuring width 612 of core 610 is the distance between point 601 and point 607, which is the width of core 610 along the measuring line defined by points 601 and 603. Likewise, the measuring width 622 of core 620 is the distance between point 603 and point 605, which is the width of core 620 along the measuring line defined by points 601 and 603. If the measuring width 612 of core 610 is greater than the measuring width 622 of core 620, then the pair measuring distance is equal to measuring width 612 of core 610.

The cores are preferably made of magnetically permeable material such as manganese zinc. The cores 50 and 60 are mounted on support base 70 such that their longitudinal axes 55 and 65 are substantially parallel to one another. The planar bottom ends 53 and 63 of the cores abut the generally planar top surface of the mounting on support base 70. The transformers are also mounted in spaced relation to each other, such that the shortest distance 75 between the outer surfaces of cores 50 and 60 is at least equal to the pair measuring distance. Given the parameters above, the distance 75 between the transformers is preferably more than or equal to 1.5 mm. However, the transformers are mounted at a distance less than about 20 times the pair measuring width, so that the overall assembly is still compact. In a highly practical arrangement, the distance between the cores should be between 1.3 times the pair measuring distance and 5 times the pair measuring distance, which, in a mixer, allows enough distance between the cores to place the diode ring between them, while still resulting in a compact unit. Optimally, the distance between the cores will be about 1.5 times the pair measuring distance.

In operation, electromagnetic interference between the transformers is substantially avoided by operating the transformers between 10 MHz to 6 GHz. For example, a 10 MHz to 6 GHz local oscillator (LO) signal is fed into port 6 across the primary winding 10 of the first transformer 2, as shown in FIG. 1. If the secondary winding has the same number of turns as the primary winding, the total voltage across the entire secondary winding will be approximately equal to the voltage across the primary winding, assuming that the primary and secondary terminating impedances are the same. However, assuming a positive cycle of the LO signal, the presence of grounded center tap 16 will force top half 12 of secondary winding 11 to be positive at the top, and grounded at the center tap. Thus, diode ring corner 32 will have a positive charge on a positive local oscillator cycle. Similarly, the bottom half 14 will be grounded at the top, and negative at the bottom. Therefore, diode ring corner 36 will have a negative charge on the positive cycle of the local oscillating signal. Due to a positive voltage at corner 32 and negative voltage at corner 36, diodes 40 and 42 will conduct, and diodes 44 and 46 will not. Thus, corner 38 is effectively isolated from the rest of the system, and no current can flow through the top half 22 of secondary winding 21. If the impedances of the halves 12 and 14 of secondary winding 11 are properly matched, and if the impedances of diodes 44 and 46 are properly matched, then the equal and opposite polarities at corners 32 and 36 will cause 34 to become effectively grounded. Thus, bottom half 24 of secondary winding 21 will be free to conduct. In sum, on a positive LO cycle, bottom half 24 of secondary winding will conduct and top half 22 will not.

On a negative cycle of the LO signal, the voltages on the windings and diode corners will be inverted. Thus, the top of top half 12 will be negative, as will be diode ring corner 32. Similarly, the bottom of bottom half 14 will be positive, as will be diode ring corner 36. Thus, on the negative LO cycle, diodes 44 and 46 will conduct and diodes 40 and 42 will not. Corner 34 will be effectively isolated from the system and no current may flow through bottom half 24 of secondary winding 21. As diode corner 34 was on the positive LO cycle, diode corner 38 will be at ground on the negative LO cycle. In sum, on a negative LO cycle, top half 22 of secondary winding 22 will conduct, and bottom half 24 will not.

Thus, the top and bottom halves of secondary winding 21 alternately conduct at the frequency set by the LO signal. This operation allows the mixing of a radio frequency (RF) signal impressed upon radio frequency port 8. When an RF signal is impressed across the primary winding 20, the corresponding electromagnetic field is translated into secondary winding 21 via core 60, and a corresponding signal is imposed within the secondary winding. The output of the mixer is the intermediate frequency (IF) port at center tap 26. As described above, the top half 22 and bottom half 24 of secondary winding 21 will alternate in conduction at a rate equal to the local oscillating signal. The current induced by the radio frequency signal in winding 21 will either flow toward or away from the center tap, depending upon which half of the secondary winding is conducting. Thus, the output or IF signal at port 7 will reflect the RF signal at port 8. Thus, the system mixes the signal at RF port 8 with the signal at LO port 6 to form the output or IF signal at port 7.

The present invention allows the use of transformers with cylindrical cores in the above circuit. If the local oscillating frequency is between 10 MHz to 6 GHz, there will be little to no interference between the two transformers. Although the present invention is not limited by any theory of operation, electromagnetic theory holds that the intensity of the magnetic flux at a given distance from an inductor decreases as the frequency of the current increases. In other words, at high frequencies, the magnetic flux generated by a transformer will remain relatively close to the core as compared to lower frequency signals. Therefore, the higher the frequency, the closer electromagnetically-sensitive objects may be placed to the transformer. This allows the two cylindrical cores to be used in close proximity to one another, without electromagnetic interference from one to the other. To further reduce the electromagnetic field outside the core, the core should be of a relatively small diameter, as the intensity of a magnetic field a given distance from a core will decrease as the diameter decreases.

Figure 3:
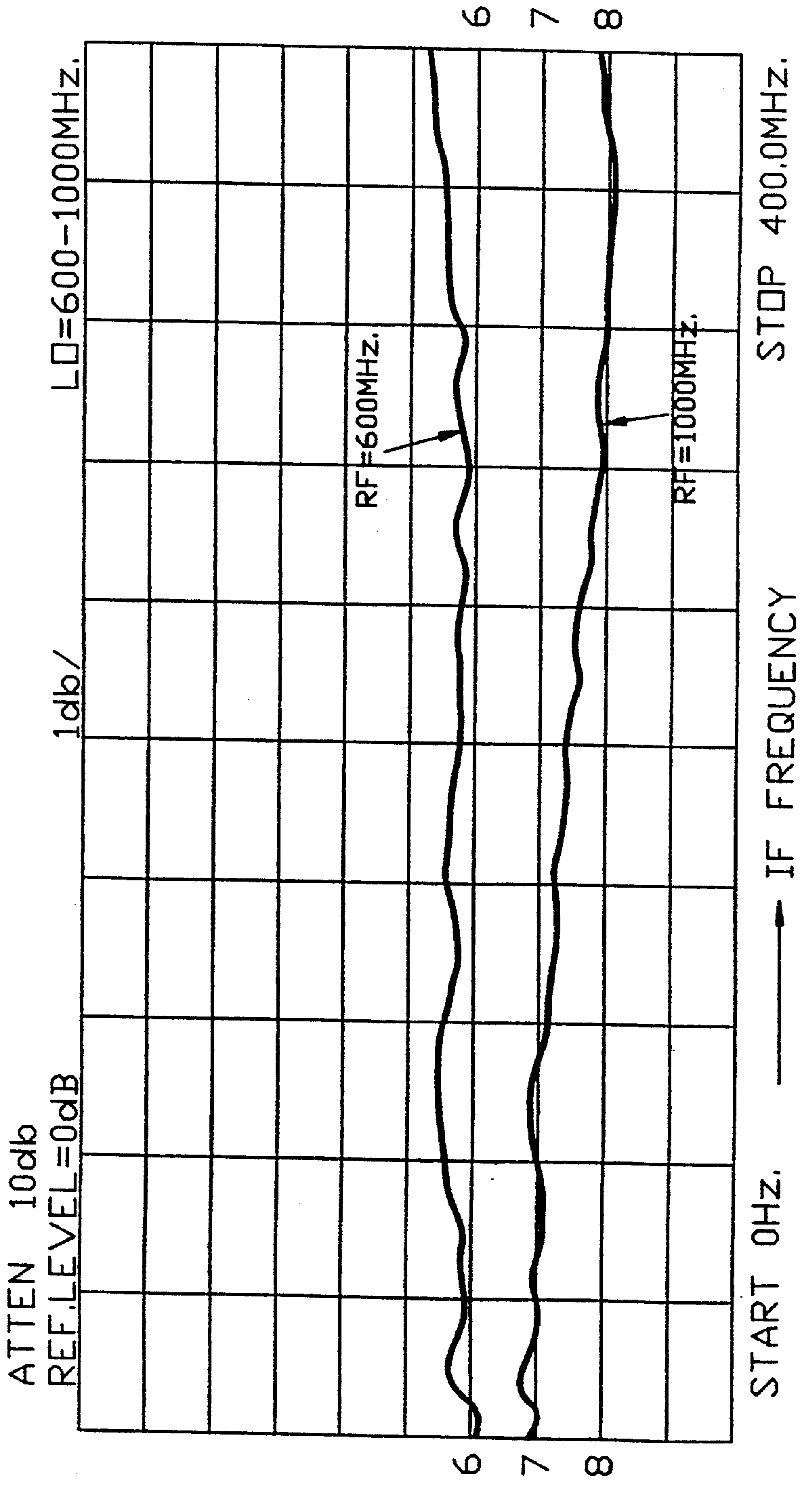
FIG. 3 is a graph of conversion loss versus frequency with two turns on each coil.
Figure 4:
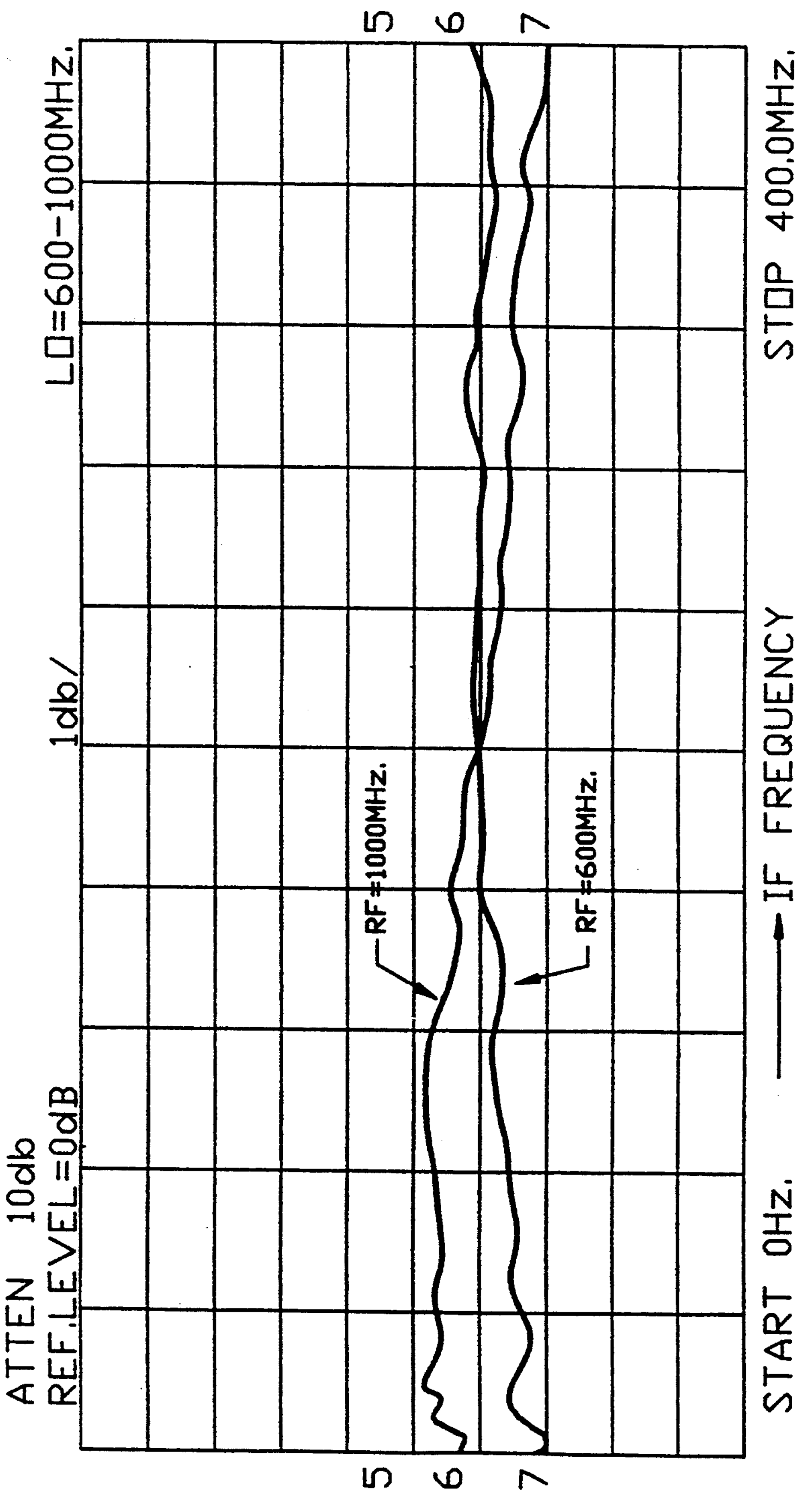
FIG. 4 is a graph of conversion loss versus frequency with three turns on each coil.

In order to promote a high performance, high frequency transformer circuit, it is preferable to avoid a large number of turns per winding on the core, as the upper frequency performance of a mixer is sacrificed as the number of turns increases. Specifically, the additional stray capacitance and self-inductance created by each extra turn of the winding impairs the performance of the transformer. FIG. 3 shows the performance of a mixer built in accordance with the present invention with the transformers having two turns of trifilar winding on each core, and FIG. 4 shows the performance of a transformer with three turns on each core. On each figure, the conversion loss of the mixer operating at two distinct radio frequencies, namely 600 MHz and 1000 MHz, is plotted over the range of intermediate frequencies created when the local oscillator signal is changed between 600 to 1000 Mhz. By comparing FIG. 3 to FIG. 4, it can be seen that at higher frequencies, i.e., RF=1000 MHz, the conversion loss increases as the winding goes from 2 turns to 3 turns. In other words, as the number of turns increases, the conversion loss increases, and the performance decreases. However, at lower frequencies, i.e., RF=600 MHz, the conversion loss decreases by adding a turn to the winding, and therefore, the performance increases. In sum, the higher the operating frequency, the better the performance at lower number of turns per winding.

In essence, by striking a proper balance between the number of turns on the windings and frequency of operation, cylindrical core transformers may be used in close proximity to one another with excellent performance characteristics.

By experimentation, it has been found that by operating a plurality of transformers with cylindrical cores in the frequency range of 10 MHz to 6 GHz, the transformers may be placed close to one another, as long as the distance between the cores remains greater than the pair measuring distance. For compactness, the distance should be as small as possible, and less than 20 times the pair measuring distance. A highly practical arrangement involves circularly uniform cylindrical transformers with windings having two to four turns, diameters of 1 mm, and the cores spaced no less than 1 mm apart, but no more than 20 mm apart, as measured between the exterior surfaces of the cores. This 1 mm spacing is sufficient to physically insert the diode ring between the two transformers. Thus, an extremely small mixer is created which can be manufactured at low cost and high efficiency.

It has been generally believed that cylindrical cores should be avoided for two reasons: their shape creates an electromagnetic field outside the core, and the electromagnetic leakage results in poor performance. Further, cylindrical cores have a relatively narrow bandwidth of good performance as compared to toroid or balun cores. Thus, balun and toroid cores have been used instead. However, by experimentation and application of electromagnetic theory, the present invention uses cylindrical cores without undue interference or loss of performance. In fact, significant advantages are gained by using cylindrical cores over baluns or toroid cores. First, a mixer with cylindrical cores can be up to 50 percent smaller in size than mixers with toroidal or balun-shaped cores operating in the same frequency range. Additionally, the minimum size for a toroid or balun core will be at least twice the diameter of the cylindrical cores of the present invention. The smaller size of the present invention results in less stray reactances, such as interwinding capacity and self inductance, because less wire is necessary to be wound around the smaller cylindrical cores compared to the toroid or balun cores. Second, production costs are also lower because of the ease in which cylindrical cores may be wound. For example, there is no need to wind a wire in and out of a hole, as is required with a toroid or balun core. This ease of winding makes the cylindrical core excellent for automation, and also reduces the chances of nicking a wire during winding. Third, grooves may be easily created on the outer surface of the core to hold the wires in place when critical accuracy is required. Such grooves are extremely expensive and impractical to create on balun and toroidal cores. Fourth, since there is no hole in the cylindrical core, the cores can be attached to the support base first and wound later. Attaching the cores first and then winding allows machines to position the transformers on the board within the specific distance ranges disclosed earlier, without fear of damaging the fine wires. Fifth, once mounted, the cylindrical cores are highly mechanically stable because the cores are affixed at their flat ends. Toroid or balun cores must be wound before mounting, and usually lack a flat surface for attachment.

Figure 7:
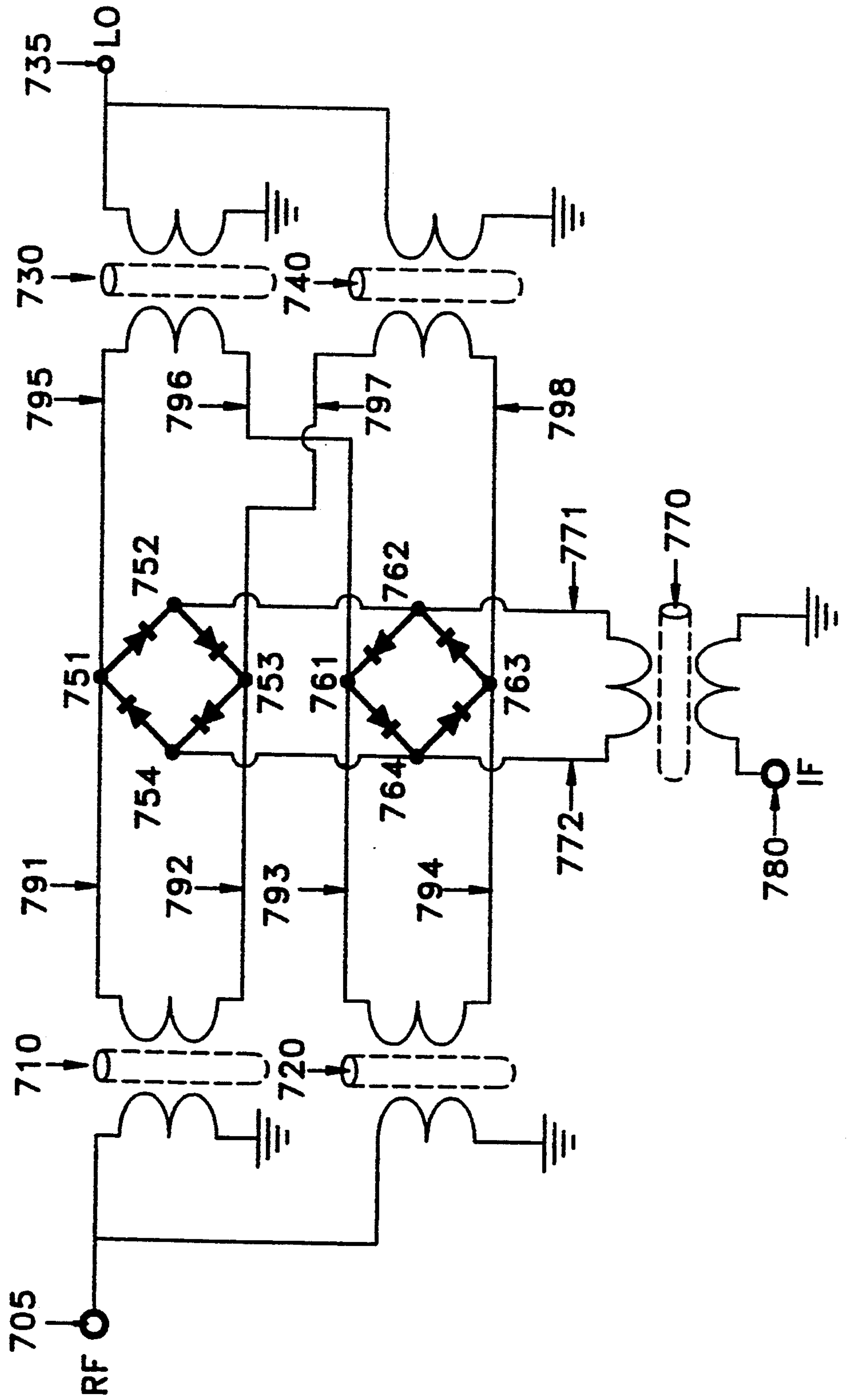
FIG. 7 is a schematic view of a triple-balanced mixer using transformers of the present invention.
Figure 8:
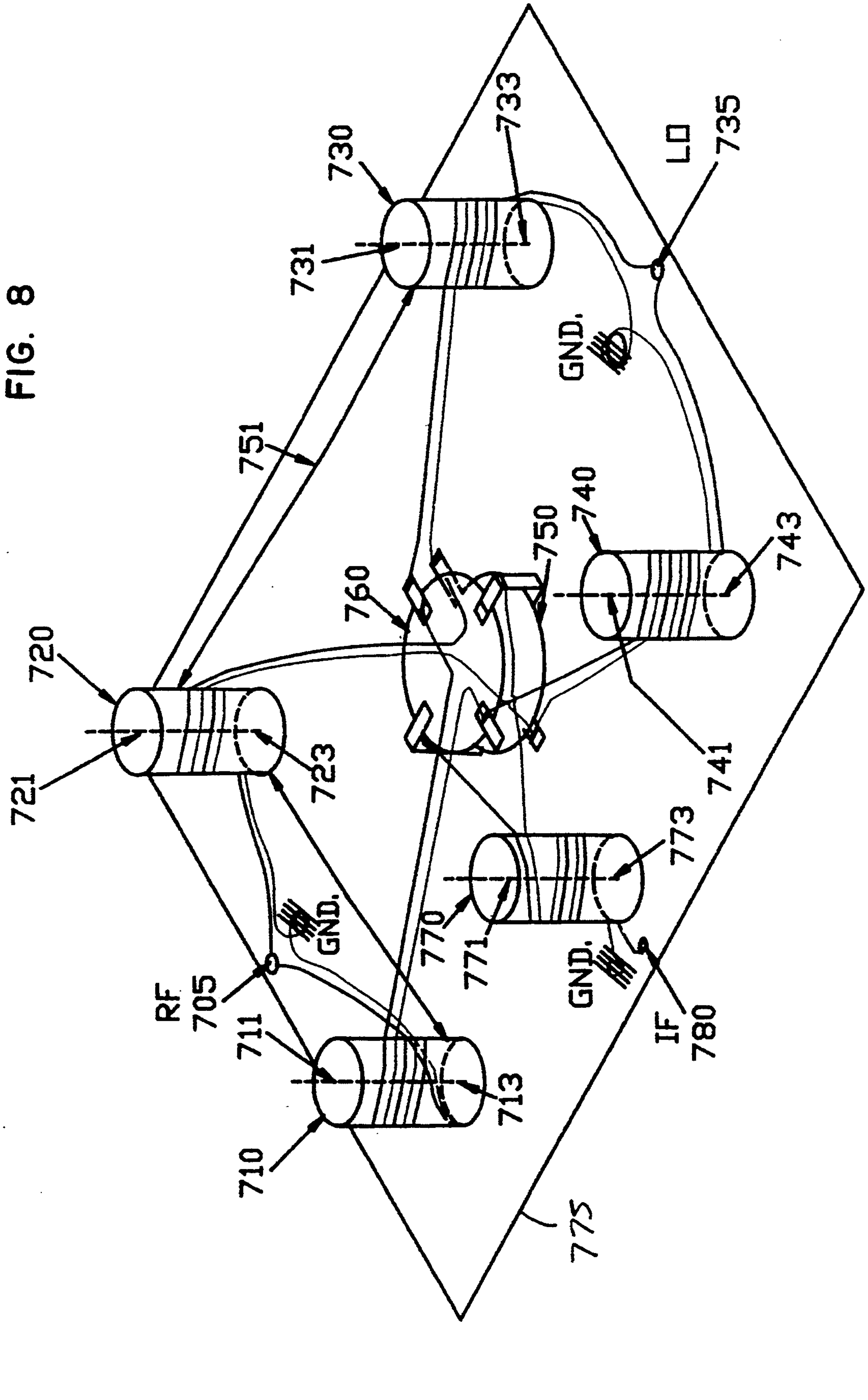
FIG. 8 is a three-dimensional view of another preferred embodiment using transformers of the present invention.

While the transformers of the present invention are shown for use in a double-balanced mixer, they may be used in any circuit which has a plurality of electromagnetic sensitive elements. For example, as shown in FIGS. 7 and 8, a triple-balanced mixer has five transformers, combinations of which may be configured in accordance with the present invention. Each of the transformers is unbalanced on the signal or input side, and balanced towards the diode rings. Generally, triple balanced mixers have a higher frequency response compared to double balanced mixers.

The radio frequency (RF) portion of the mixer is derived by interconnecting two unbalanced to balanced transformers. Specifically, transformers 710 and 720 accept a radio frequency signal from RF port 705. Similarly, transformers 730 and 740 receive a local oscillator (LO) signal from LO port 735. The secondary windings of transformers 710, 720, 730, and 740 are connected to diode rings 750 and 760. Thus, the balanced ports 791 and 792 from RF transformer 710 are connected to opposite corners 751 and 753, respectively, of diode ring 750, and balanced ports 793 and 794 from RF transformer 720 are connected to opposite corners 761 and 763, respectively, of diode ring 760. The balanced ports from the LO portion of the mixer are also connected to the corners of the diode rings, such that balanced port 795 from LO transformer 730 and the balanced port 797 from LO transformer 740 are connected to opposite corners 751 and 753, and such that the balanced port 796 from LO transformer 730 and the balanced port 798 from LO transformer 740 are connected to opposite corners 761 and 763.

The two diode rings 750 and 760 are interconnected such that corner 752 of diode ring 750 is connected to corner 762 of diode ring 760, and corner 754 of diode ring 750 is connected to corner 764 of diode ring 760. The balanced ports, namely 771 and 772 of transformer 710 are connected to the above diode junction from which the intermediate frequency (IF) signal is outputted at port 780.

As can be seen from FIG. 8, all the cores of transformers 710, 720, 730, 740 and 770 are uniformly circularly cylindrical, having planar top ends 711, 721, 731, 741 and 771, respectively, and being attached to the mounting board 775 at planar bottom ends 712, 722, 732,742 and 772, respectively. As discussed above, the cores may conform to other elongated shapes.

Electromagnetic interference between the transformers of RF port 705, LO port 735 and IF port 780 is undesirable, and should be avoided. Thus, the distance from the outer surfaces of transformer 710 and transformer 730 should be no less than the pair measuring distance as defined by the size and shape of the transformers and as discussed above. Likewise, the distance between transformer 710 and transformer 740 should be no less than the pair measuring distance defined by the transformers 710 and 740, the distance between transformer 720 and transformer 730 should be no less than the pair measuring distance defined by the transformers 720 and 730, and the distance between transformer 720 and transformer 740 should be no less than the pair measuring distance defined by the transformers 720 and 740. As transformers 710 and 720 receive and output the same signal, electromagnetic interference between transformers 710 and 720 is insignificant, and the transformers may be any distance apart. For the same reasons, the distance between transformers 730 and 740 may be of any length.

Further, the distance between IF transformer 770 and any other transformer, namely, transformers 710, 720, 730 and 740, should be greater than or equal to the pair measuring distance, as defined by the IF transformer and the other transformers from which transformer 770 is spaced.

The present invention is useful in circuits beyond mixers, as well. This configuration of transformers could be used in any circuit where it is desirable to prevent electromagnetic interference between two or more transformers. In fact, the present invention is particularly suited for use in modulators, which are essentially a combination of mixers and power dividers, and have a multitude of transformers. As it is often highly advantageous to make a modulator as small as possible, such as in cellular phones, the present invention is uniquely directed to the combined goals of high performance and miniature size. Transformers according to the present invention may be used in other circuits as well, such as amplifiers, single balanced mixers, couplers, phase shifters, phase detectors, and limiters.

As these and other variations and combination of the features described above can be utilized without departing from the present invention as defined in the appended claims, the foregoing description of the preferred embodiment should be understood as being illustrative rather than as limiting the invention as defined in the claims.

We claim:

1. A transformer circuit comprising:
a mounting;
a first transformer comprising an elongated core with a longitudinal axis and an outer surface, and primary and secondary windings disposed on said outer surface;
a second transformer comprising an elongated core with a longitudinal axis and an outer surface, and primary and secondary windings disposed on said outer surface;
each said core having a maximum width perpendicular to the longitudinal axis of each said core, said maximum widths defining a pair measuring distance equal to the largest of said maximum widths;
first input means for providing a first electrical input signal between the frequencies of about 10 MHz to 6 GHz to said primary winding of said first transformer;
second input means for providing a second electrical input signal to said primary winding of said second transformer; and
circuit means for interconnecting said secondary windings of said transformers and associated with an output from said transformer circuit, said output providing an output signal derived from said first input signal and said second input signal;
said first and second transformers being attached to said mounting wherein said longitudinal axes of said cores are substantially parallel to one another and the shortest distance between the outer surface of said first core and the outer surface of said second core is about equal to or greater than the pair measuring distance and about equal to or less than 20 times the pair measuring distance.

2. The circuit of claim 1, wherein said shortest distance is about equal to or greater than the 1.3 times the pair measuring distance and about equal to or less than 5 times the pair measuring distance.

3. The circuit of claim 1, wherein said shortest distance is about equal to 1.5 times the pair measuring distance.

4. The circuit of claim 1, wherein said shortest distance is about equal to 1.5 mm.

5. The circuit of claim 1, wherein the number of turns of each said primary winding and each said secondary winding is preferably between two to four turns.

6. The circuit of claim 5, wherein:
said first or input means includes means for providing a local oscillator signal to said first input means;
said second input means includes means for providing a radio frequency signal; and
said output of said circuit means comprises an intermediate frequency output port for emitting a signal derived from said local oscillator signal and said radio frequency signal.

7. The circuit of claim 6, wherein at least a portion of said circuit means is disposed between said first and second transformers.

8. The circuit of claim 7, wherein said means for interconnecting circuit includes a diode ring, said diode ring disposed between said first and second transformers.

9. The circuit of claim 6, wherein the maximum widths of said cores are equal.

10. The circuit of claim 9, wherein the maximum width of said cores are equal to about 1 mm each.

11. The circuit of claim 1, wherein each said core includes at least one planar end, said planar ends abutting said mounting.

12. The circuit of claim 11 wherein said mounting has a planar surface and said cores abut said planar surface.

13. The circuit of claim 12 wherein said mounting is a flat panel.

14. The circuit of claim 11, wherein said planar ends are circular.

15. A transformer circuit comprising:

a mounting;

a first transformer comprising an elongated core with a longitudinal axis and an outer surface, and primary and secondary windings disposed on said outer surface;

a second transformer comprising an elongated core with a longitudinal axis and an outer surface, and primary and secondary windings disposed on said outer surface;

a measuring line defined by the line between the point on the outer surface of said first core which is closest to the outer surface of said second core, and the point on the outer surface of said second core which is closest to the outer surface of said first core;

each said core having a measuring width, said measuring width defined by the width of each said core along the measuring line, said measuring widths defining a pair measuring distance equal to the largest of said measuring widths;

first input means for providing a first electrical input signal between the frequencies of about 10 MHz to 6 GHz to said primary winding of said first transformer;

second input means for providing a second electrical input signal to said primary winding of said second transformer; and circuit means for interconnecting said secondary windings of said transformers and associated with an output from said transformer circuit, said output providing an output signal derived from said first input signal and said second input signal;

said first and second transformers being attached to said mounting wherein said longitudinal axes of said cores are substantially parallel to one another and the shortest distance between the outer surface of said first core and the outer surface of said second core is about equal to or greater than the pair measuring distance and about equal to or less than 20 times the pair measuring distance.

16. The circuit of claim 15 wherein the cross section of said cores perpendicular to said longitudinal axis is uniformly elliptical.

17. The circuit of claim 16 wherein said shortest distance is about equal to 1.5 times the pair measuring distance.

18. The circuit of claim 17 wherein the number of turns of each said primary winding and each said secondary winding is preferably between two to four turns.

19. A triple-balanced mixer comprising:

a mounting;

a first pair of transformers, each transformer comprising an elongated core with a longitudinal axis and an outer surface, and primary and secondary windings disposed on said outer surface;

a second pair of transformers, each transformer comprising an elongated core with a longitudinal axis and an outer surface, and primary and secondary windings disposed on said outer surface;

each said core having a maximum width perpendicular to the longitudinal axis of each said core, said maximum widths defining a pair measuring distance equal to the largest of said maximum widths;

a local oscillator signal port for providing a local oscillator signal between the frequencies of about 10 MHz to 6 GHz to the primary windings of said first pair of transformers;

a radio frequency port for providing a radio frequency signal to the primary windings of said second pair of transformers;

circuit means for interconnecting said secondary windings of said transformers and associated with an intermediate frequency port from said transformer circuit, said intermediate frequency port providing an intermediate frequency signal derived from said radio frequency signal and said local oscillator signal; and said first pair and second pair of transformers being attached to said mounting wherein said longitudinal axes of said cores are substantially parallel to one another and the shortest distance between the outer surface of any one of the transformers of said first pair and the outer surface of any one of the transformers of said second pair is about equal to or greater than the pair measuring distance and about equal to or less than 20 times the pair measuring distance.

20. The circuit of claim 19 further comprising a fifth transformer having an elongated core with a longitudinal axis and an outer surface, and primary and secondary windings disposed on said outer surface;

said core of said fifth transformer having a maximum width perpendicular to the longitudinal axis of each said core, said maximum width of said fifth transformer and said maximum widths of said first pair of transformers defining a first pair measuring distance equal to the largest of such maximum widths, and said maximum width of said fifth transformer and said maximum widths of said second pair of transformers defining a second pair measuring distance equal to the largest of such maximum widths;

said primary winding of said fifth transformer connected to said circuit means, and said secondary winding of said fifth transformer connected to said intermediate frequency port;

said fifth transformer being attached to said mounting such that said longitudinal axis of said fifth core is substantially parallel to said longitudinal axes of the transformers of said first and second pairs, and wherein the shortest distance between the outer surface of said fifth transformer and the outer surface of any one of said transformers of said first pair is about equal to or greater than the first pair measuring distance and about equal to or less than 20 times the first pair measuring distance, and the shortest distance between the outer surface of said fifth transformer and the outer surface of any one of said transformers of said second pair is about equal to or greater than the second pair measuring distance and about equal to or less than 20 times the second pair measuring distance.

21. The circuit of claim 19 wherein said shortest distance is about equal to 1.5 times the pair measuring distance.

22. The circuit of claim 21 wherein the number of turns of each said primary winding and each said secondary winding is preferably between two to four turns.

* * * * *